United States Patent
Broutin et al.

(10) Patent No.: US 6,839,364 B1
(45) Date of Patent: Jan. 4, 2005

(54) FEEDBACK CONTROL LOOP OPERATING SYSTEM FOR TUNABLE SOURCE

(75) Inventors: Scott L. Broutin, Kutztown, PA (US); James K. Plourde, Allentown, PA (US); John W. Stayt, Jr., Schnecksville, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 54 days.

(21) Appl. No.: 09/672,050

(22) Filed: Sep. 29, 2000

(51) Int. Cl.[7] .................................................. H01S 3/10
(52) U.S. Cl. ............... 372/20; 372/29.011; 372/29.015; 372/32; 372/38.01; 372/38.07
(58) Field of Search ............................. 372/20, 29.011, 372/29.014, 29.015, 31, 32, 38.01, 38.02, 38.07

(56) References Cited

U.S. PATENT DOCUMENTS

| | | | | |
|---|---|---|---|---|
| 5,042,042 A | * | 8/1991 | Hori et al. ..................... 372/32 |
| 5,396,059 A | | 3/1995 | Yeates | |
| 5,448,629 A | | 9/1995 | Bosch et al. | |
| 5,509,023 A | * | 4/1996 | Glance et al. ................. 372/20 |
| 5,541,945 A | * | 7/1996 | Yamaguchi et al. .......... 372/20 |
| 5,717,712 A | | 2/1998 | Swaminathan et al. | |
| 5,778,017 A | * | 7/1998 | Sato et al. ..................... 372/38 |
| 5,832,014 A | * | 11/1998 | Johnson ........................ 372/32 |
| 5,943,352 A | * | 8/1999 | Fee ................................ 372/32 |
| 5,956,356 A | | 9/1999 | Bergmann et al. | |
| 6,064,681 A | | 5/2000 | Ackerman | |
| 6,101,200 A | * | 8/2000 | Burbidge et al. ............. 372/29 |
| 6,120,190 A | * | 9/2000 | Leard et al. ................... 385/88 |
| 6,212,210 B1 | * | 4/2001 | Serizawa ...................... 372/32 |
| 6,222,861 B1 | * | 4/2001 | Kuo et al. ..................... 372/20 |
| 6,233,262 B1 | * | 5/2001 | Mesh et al. ................... 372/32 |
| 6,292,498 B1 | * | 9/2001 | Pfaff ............................. 372/32 |
| 6,330,253 B1 | * | 12/2001 | Tuganov et al. ............... 372/9 |
| 6,341,189 B1 | * | 1/2002 | Deacon ........................ 385/130 |
| 6,351,476 B2 | * | 2/2002 | Kner et al. .................... 372/20 |
| 6,359,918 B1 | * | 3/2002 | Bielas ........................ 372/38.01 |
| 6,393,041 B1 | * | 5/2002 | Sato ........................ 372/29.021 |

* cited by examiner

Primary Examiner—David Porta
Assistant Examiner—Davienne Monbleau
(74) Attorney, Agent, or Firm—Dickstein Shapiro Morin & Oshinsky LLP

(57) ABSTRACT

Multiple operational parameters for a laser device are simultaneously controlled, optimized and/or stabilized by a software-based system with nested and interactive feedback control loops. Start-up mode, channel lock mode and channel change mode operations are described. The invention may be applied to a laser device with monolithic DBR tuning and gain sections, and also to systems with separate amplifiers. An optical filter system for normalizing-out changes in output power in relation to wavelength control is also disclosed.

17 Claims, 3 Drawing Sheets

FEEDBACK CONTROL LOOP OPERATING SYSTEM FOR TUNABLE SOURCE

BACKGROUND OF THE INVENTION

1. Field of the Invention

The present invention relates generally to systems for operating, stabilizing and/or controlling tunable light sources, for use for example in communications systems. The present invention also relates to a digital software-based system with multiple control loops for controlling a laser device, such as a distributed Bragg reflector (DBR) device.

2. Description of the Related Art

Analog-based systems, with ultra-fast control loops operating inside of other loops, have been suggested for use in controlling DBR laser devices. Such analog-based systems lack the flexibility of digital control systems, however. Moreover, the analog-based systems do not provide the ability to fully automate the control process via operating software.

Multi-parameter control (wavelength, mode-hop avoidance, power and optical amplifier gain) of DBR lasers presents two fundamental problems. The first is that, to mode-stabilize a DBR device, the output from the backface must be monitored during ramping of the current to the tuning section. The ramping of the tuning current tends to alter the output wavelength, which is undesirable. The other problem is that ramping of the tuning current affects the amplitude detected by the backface monitor. The characteristics of these changes are fundamental to proper mode stabilization. Any changes, either deliberate or due to aging effects, in the current to the gain section of the device will also produce changes at the backface that could be interpreted as actual changes in the tuning section. There is a need in the art for a digital feedback control system, with nesting and interaction between the various control functions, that can provide a complete DBR operating control solution.

SUMMARY OF THE INVENTION

The present invention relates to a method of operating a distributed Bragg reflector (DBR) laser device. The method includes the steps of using a first feedback loop to periodically adjust the temperature (or another wavelength-related characteristic) of the laser device in response to a sensed wavelength, and using a second feedback loop to periodically adjust the tuning current in response to sensed amplitude. If desired, the two feedback loops may be operated at the same time.

The present invention also relates to a method of starting-up a tunable light source (such as a DBR light source). According to this aspect of the invention, a tuning current value is calculated based on stored data representative of mode-hopping values for the light source. The stored data may be maintained in a look-up table, for example. In a preferred embodiment, the wavelength channel may be changed by applying a tuning current that is based on the same stored mode-hopping data.

The present invention also relates to a system for stabilizing the output of a laser device. The system operates by adjusting a tuning current in response to output power, and simultaneously adjusting a wavelength characteristic of the device (e.g., temperature) in response to an optically filtered fraction of the output power.

An advantageous feature of the present invention is that numerous operational parameters for a DBR laser device can be simultaneously controlled and stabilized. In a preferred embodiment, an intelligent interaction of the feedback control loops is used to achieve the desired stabilization of multiple parameters in a software-driven closed-loop feedback system.

According to yet another aspect of the invention, an etalon temperature loop is nested within a tuning current loop and a power control loop. The tuning current loop may be used to control the side mode suppression ratio (SMSR) or some other operational parameter. The power control loop may be operated based on the amplitude detected by a backface monitor. This arrangement may be suitable for operating and/or stabilizing a two-section DBR laser device (i.e., one that has tuning and gain sections only).

According to another aspect of the invention, the power control loop may be operated based on-the output power of a semiconductor optical amplifier (SOA). In this case, the tuning current loop may be nested within the power control loop, and the temperature loop may be nested within the tuning current loop. This arrangement may be suitable for operating and/or stabilizing a four-section DBR laser device (tuning, gain, optical amplifier and modulator sections).

An object of the invention is to provide a digital control system that can be flexibly adjusted for changes in operating parameters and the like via software control.

BRIEF DESCRIPTION OF THE DRAWINGS

The foregoing and other advantages and features of the invention will become more apparent from the detailed description of preferred embodiments given below with reference to the accompanying drawings, in which.

DETAILED DESCRIPTION OF PREFERRED EMBODIMENTS

Figure 1:
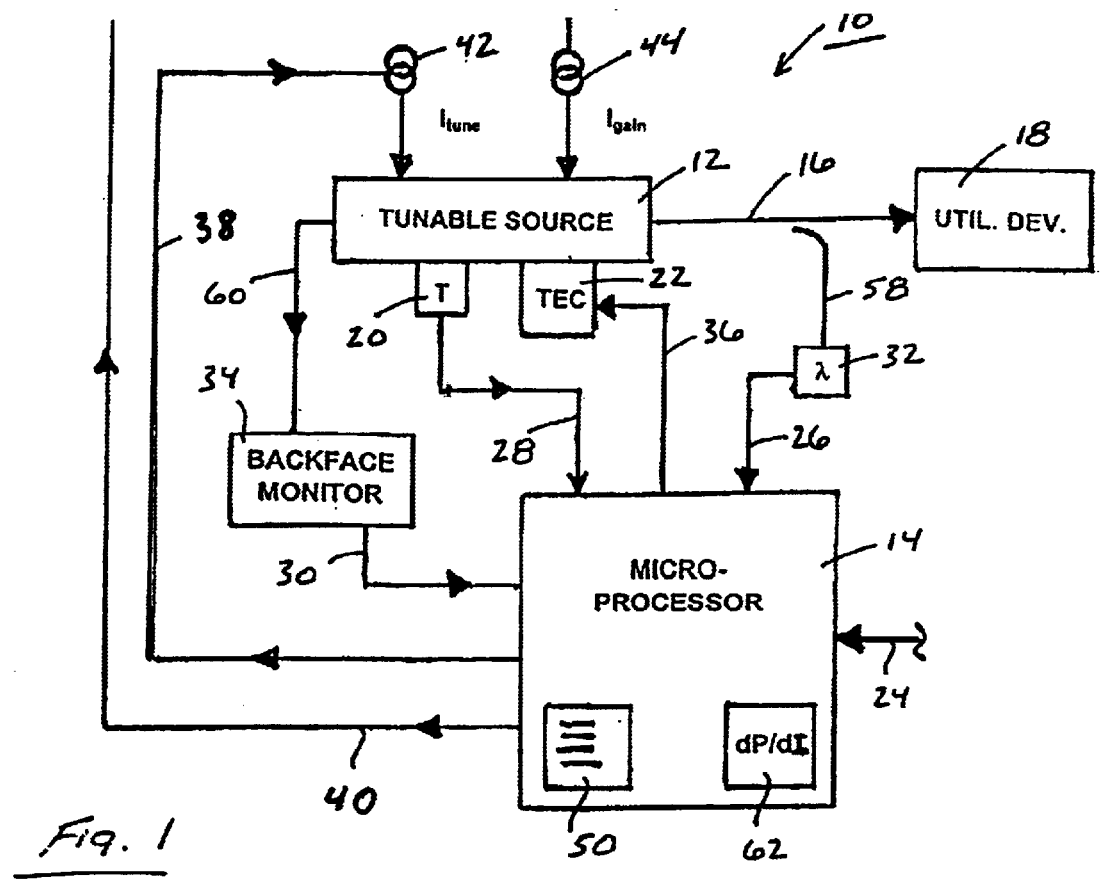
FIG. 1 is a schematic view of a feedback control loop operating system constructed in accordance with one aspect of the present invention.

Referring now to the drawings, where like reference numerals designate like elements, there is shown in FIG. 1 a system 10 for operating a tunable, distributed Bragg reflector (DBR) laser device 12. The laser device 12 may be arranged to generate a light output at any one of a plurality of center wavelengths (for example, the channel wavelengths of a dense wavelength division multiplexing (DWDM) communications system), under the control of a microprocessor 14. The light output of the laser device 12 is launched into a suitable optical communications fiber 16, and from there into a suitable communications node or other device 18, for use in the communications system as desired.

The illustrated laser device 12 has at least two monolithic, optically coupled sections arranged in tandem, namely, a DBR tuning section and a gain section. In addition, the device 12 has a temperature sensor 20 and a thermo-electric cooler (TEC) 22. The temperature sensor 20 and the TEC 22 may be thermally coupled to the DBR tuning and gain sections. The TEC 22 may be used to control the temperature of the laser device 12, to thereby affect the wavelength of the output light (16) as discussed in more detail below.

The microprocessor 14 receives various input signals 24, 26, 28, 30 from a remote input device (not shown), a wavelength discriminator 32, the temperature sensor 20, and a backface monitor 34, respectively. The microprocessor 14 provides an output signal 36 to control the TEC 22. In addition, the microprocessor 14 provides output signals 38, 40 to suitable current sources 42, 44, such that tuning and gain currents $I_{tune}$, $I_{gain}$ are supplied to the DBR tuning and gain sections of the laser device 12, respectively.

In operation, the remote input device (not shown) is used to apply a start-up signal 24 to the microprocessor 14. The input signal 24 corresponds to a selected start-up wavelength or channel. In response, the microprocessor 14 determines a start-up tuning current $I_{tune}$ with reference to a suitable look-up table 50. In the illustrated embodiment, the look-up table 50 contains data representative of tuning currents at which DBR mode-hopping would occur. The microprocessor 14 proceeds to look up the tuning currents $I_{upper}$, $I_{lower}$ that bound the selected start-up wavelength, and then sets the tuning current $I_{tune}$ at a calculated value between the two bounding currents $I_{upper}$, $I_{lower}$.

Thus, in a preferred embodiment of the invention, the tuning current $I_{tune}$ initially applied to the DBR tuning section of the laser device 12 is defined according to the following expression (equation (1)):

$$I_{tune}=((I_{upper}-I_{lower})/3)+I_{lower} \qquad , (1)$$

where $I_{upper}$ and $I_{lower}$ are the two mode-hopping tuning currents stored in the look-up table 50, immediately above and below the selected start-up wavelength. The present invention should not be limited, however, to the details of the preferred embodiments shown and described herein. In particular, the number "3" in equation (1) could be various other numbers or parameters. If desired, the number could be correlated to the exact ITU grid channel.

Figure 2:
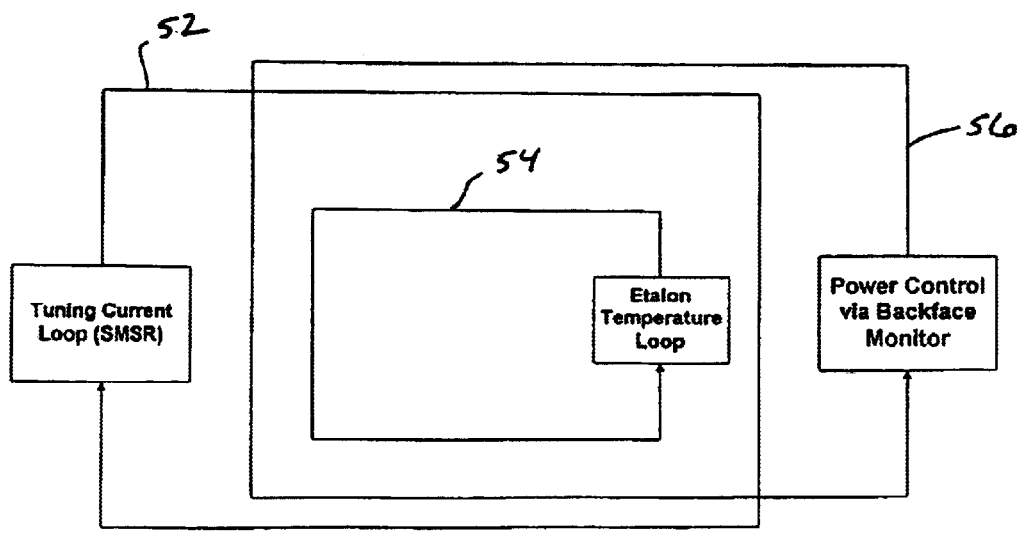
FIG. 2 illustrates the software-based nesting and interaction of the control loops for the system of FIG. 1.

At the same time, a lower limit $I_{limit}$ may be set for the tuning current $I_{tune}$, for use during operation of the tuning current loop 52 (FIG. 2). The tuning current loop 52 may contain software that is programmed to prevent the tuning current $I_{tune}$ from becoming lower than a "dangerous" value during slope determination, to prevent unacceptable degradation of the side mode suppression ratio (SMSR) or a mode. Thus, the tuning current $I_{tune}$ applied to the DBR tuning section of the laser device 12 is maintained greater than or equal to the lower limit $I_{limit}$.

In a preferred embodiment of the invention, the lower limit $I_{limit}$ may be set, for example, according to equation (2) as follows:

$$I_{limit}=1.05*I_{lower}, \qquad (2)$$

such that the factor of safety is 5% of the lower mode-hopping current $I_{lower}$ bounding the selected start-up wavelength, according to the data in the look-up table 50. As noted above, however, the present invention should not be limited to the preferred embodiments shown and described in detail herein. An advantage of the present invention is that relationships such as equations (1) and (2) may be readily changed by modifying the software code stored in the microprocessor 14 as needed to accommodate the particular mode/output characteristics of the laser device 12. The software also may be changed over time (e.g., the look-up table 50 may be updated), if desired, to accommodate for aging of the laser device 12 and/or other components.

The temperature loop 54 (FIG. 2) for the system 10 includes the discriminator 32 (FIG. 1) and the TEC 22 (controlled by the software-based operation of the microprocessor 14). In the illustrated embodiment, the temperature loop 54 is engaged and operated at the same time as the start-up tuning current $I_{tune}$ is applied to the laser device 12. The temperature loop 54 is used to lock the output light (16) of the laser device 12 at a stable wavelength. The temperature loop 54, whose software is operationally nested within the tuning current loop 52 and a power control loop 56 as shown in FIG. 2, operates as follows:

The discriminator 32 generates a signal 26 representative of the wavelength of the output light in the fiber 16. The discriminator 32 may be connected to the optical fiber 16 by a suitable tap 58 of the type shown in U.S. Pat. No. 6,064,681 (Ackerman), the entire disclosure of which is incorporated herein by reference. The microprocessor 14 sends a signal 36 to the TEC 22 to adjust the temperature of the laser device 12 to bring the sensed wavelength (at the tap 58) in line with the desired wavelength. The temperature loop 54 is updated periodically according to a clock in the microprocessor 14 such that the wavelength sensing and corresponding temperature updating occurs essentially continuously.

In a preferred embodiment of the invention, the temperature loop 54 is operated at an update rate that is ten to thirty times faster (depending on the $I_t$ increment and mode being worked) than the update rate of the tuning current loop 52 (discussed in more detail below). In the embodiment shown in FIG. 2, the temperature loop 54 must be operated whenever the tuning current loop 52 is engaged, to thereby hold the output wavelength at the tap 58 within acceptable locking specifications.

The tuning current loop 52 is made up of the backface monitor 34 and the tuning current source 42 (operated under the control of output signal 38 from the microprocessor 14). The tuning current loop 52 operates to adjust, control and/or optimize the tuning current $I_{tune}$ as a function of the power or amplitude at the laser device backface 60, as detected by the backface monitor 34.

During an initial portion of the start-up phase, while the temperature loop 54 is operating, the tuning current loop 52, under the control of suitable software in the microprocessor 14, performs a ramping up and down of the tuning current $I_{tune}$. In particular, the microprocessor 14 alternately adjusts the output signal 38 up and down to effectively "walk up" and down a curve representing the relationship between the backface amplitude (60) and the applied tuning current $I_{tune}$, for the operating mode. During the "walking" operation, the tuning current loop 52 generates point-by-point data representative of the sensed relationship between the backface amplitude (60) and the applied tuning current $I_{tune}$.

As the data is generated and accumulated during the "walking" phase, local slope values representative of backface amplitude as a function of tuning current are calculated, and the slope values dP/dI are stored in a suitable memory location 62 in the microprocessor 14. The temperature loop 54 is operated throughout the generation of the slope data (62), such that the device output (16) is maintained at a fixed wavelength, and then a desired locking slope value is determined based on the stored data (62).

Once a value equal to or close to the desired locking slope value is defined by the microprocessor 14, an optimized tuning current $I_{tune}$ is output to the DBR tuning section to hold the laser device 12 in the neighborhood of the desired locking slope value, at a point dependent on the percentage of the mode width that was used to scan and determine the slope value during the "waiting" phase. In a preferred embodiment of the invention, the scanning range is set at 5% of the mode width, but other scanning percentages may be programmed into the microprocessor 14 to accommodate other values that are considered safe with respect to mode-hopping, relative to predetermined locking requirements. The locking requirements may be determined based in part on a desired signal-to-noise ratio (S/N) for the system 10.

Once the above-described initialization operations are completed, the tuning current loop 52 may be disengaged, and then the power control loop 56 may be engaged to apply sufficient gain current $I_{gain}$ to the laser device 12 to bring the backface power (sensed by the monitor 34) up to a constant level without causing a mode-hop in the device 12. The power control loop 56 adjusts the gain current $I_{gain}$ in response to the signals 30 from the backface monitor 34. The start-up phase is completed when the backface power (60) is brought up to the desired, constant level. In the illustrated system 10, if the tuning current $I_{tune}$ were not properly set prior to engaging the power control loop 56, then an increase in the current $I_{gain}$ applied to the gain section of the device 12 could force a mode-hop despite operation of the temperature loop 54 (e.g., due to local heating). Consequently, in the system 10 shown in FIG. 1, it is advantageous to operate the tuning current loop 52 before the power control loop 56 is first engaged by the microprocessor 14.

After the above-described start-up phase is completed, the system 10 may be operated in a channel lock mode. In the channel lock mode, the tuning current loop 52 only needs to be engaged from time to time. That is, the tuning current loop 52 may be used to adjust the tuning current $I_{tune}$ only during such times as when the backface monitor 34 senses that the device 12 has shifted into a less than ideal SMSR position.

The tuning current loop 52 may be activated while the power control loop 56 adjusts the gain current $I_{gain}$. In the embodiment shown in FIG. 3, although the gain section of the device 104 is relied upon to hold a constant power output on line 16, it is not necessary to shut down the power control loop 56 during ramping of the tuning current loop 52. Since both loops 52, 56 respond to signals 30 from the same monitor 34, however, the time-constraints for the two loops 52, 56 may have to be set appropriately to prevent them from interacting with each other. If a very slow tuning current loop 52 is employed, it may be preferable to completely disengage the power control loop 56 during operation of the tuning current loop 52. In any event, the temperature loop 54 may be operated at all times to maintain the desired wavelength lock.

In a preferred embodiment of the invention, there is enough slope in each operational wavelength curve to allow a ½-channel definition via an etalon and temperature, and it appears that laser tuning via the temperature loop 54 does not shift the applicable tuning current curves relative to the wavelength curves. Thus, by using an appropriate control sign inversion ((REF−ETALON)/REF) vs. ((ETALON−REF)/REF) it is possible to lock the wavelength of the light output (16) on the opposite slopes of a 100 GHz etalon. This, with an appropriate calibration, would make it possible to achieve a 50 GHz channel spacing for the device 12.

According to yet another aspect of the invention, full channel changes may be accomplished via the same look-up table method described above in connection with the start-up phase. Moreover, once a channel tuning slope dP/dI has been defined during a prior channel change, it is stored in the second memory location 62. When the system 10 later returns to that channel, a stable tuning current $I_{tune}$ may be applied immediately to the laser device 12, by referring to the memory 62, to maintain the desired SMSR and to avoid a mode-hop.

Prior to an actual channel change, a changed current $I_{change}$ may be abruptly applied to the gain section of the device 12, via the second current source 44, to help ensure that the operational gain current $I_{gain}$ has not redefined the tuning current $I_{tune}$ that defines the point of mode-hop. The changed current $I_{change}$ may be defined empirically as follows (equation (3)):

$$I_{change} = (I_{gain} \pm 4) * \Delta_{channel}^2, \qquad (3)$$

where $I_{change}$ is the current applied abruptly to the laser device 12, $I_{gain}$ is the current applied to the gain section of the device 12 before the abrupt change, and $\Delta_{channel}$ is the difference between the number of the then-operating channel and the number of the channel to which the laser device 12 is to be changed.

Figure 3:
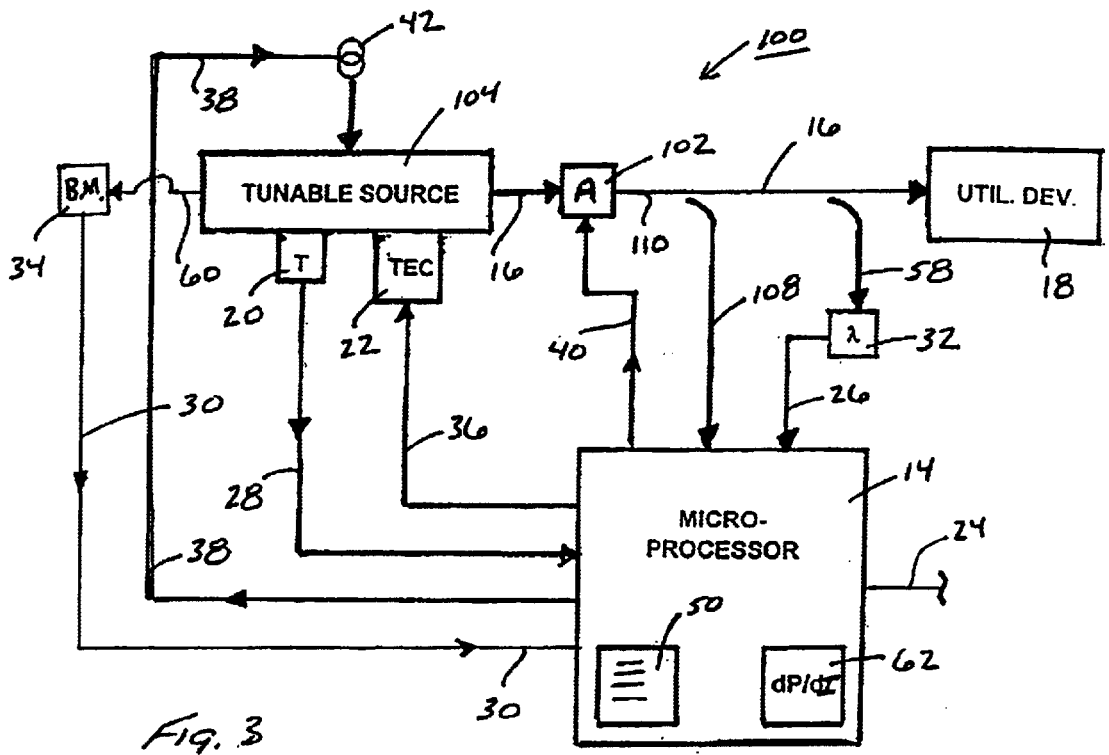
FIG. 3 is a schematic view of a system constructed in accordance with another aspect of the present invention.
Figure 4:
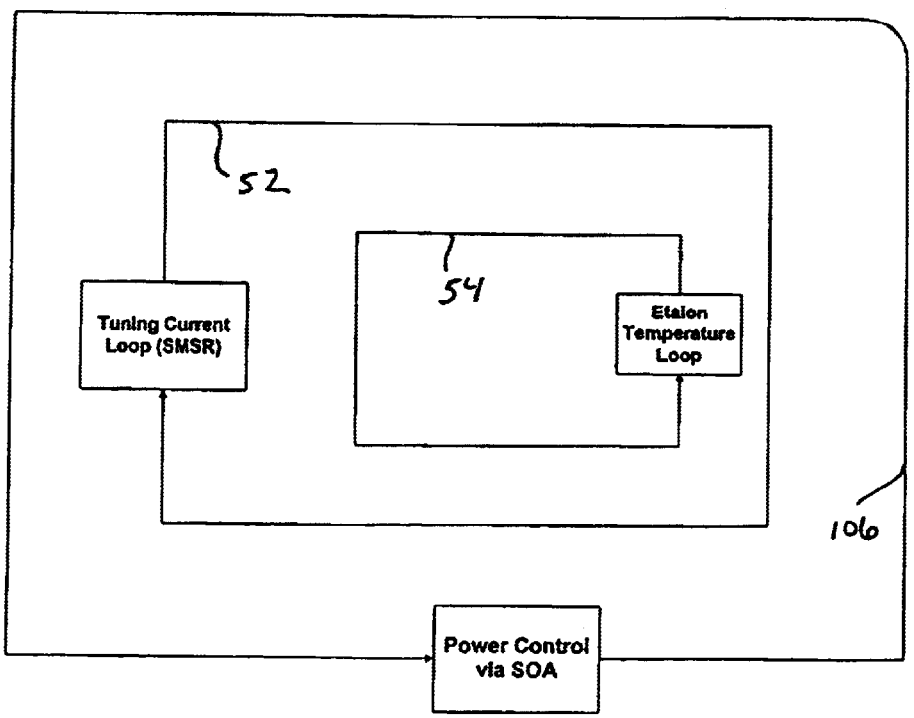
FIG. 4 illustrates the nesting and interaction of the control loops for the system of FIG. 3.

The system 100 shown in FIG. 3 has a semiconductor optical amplifier (SOA) 102. In the illustrated system 100, the amplitude signal for the power control loop 106 (FIG. 4) is received via a suitable tap 108 at the output 110 of the SOA 102, rather than at the backface of the laser device 104. Since the tuning current loop 52 and the power control loop 106 have different inputs (the backface monitor 34 and the in-line tap 108, respectively), the tuning current loop 52 may be operationally nested entirely within the power control loop 106. That is, the tuning current loop 52 may be operated by the microprocessor 14 whenever the power control loop 106 is engaged. In addition, the software for the system 100 may be provided with a backface loop 108 for compensating for device aging effects. The backface loop 108 may be operated based on amplitude signals 30 provided by the backface monitor 34. The system 100 (FIG. 3) is otherwise the same as the system 10 shown in FIG. 1. In both systems 10, 100, the temperature loop 54 is operationally nested within the tuning current loop 52 (by suitable software stored in the processor 14).

Figure 5:
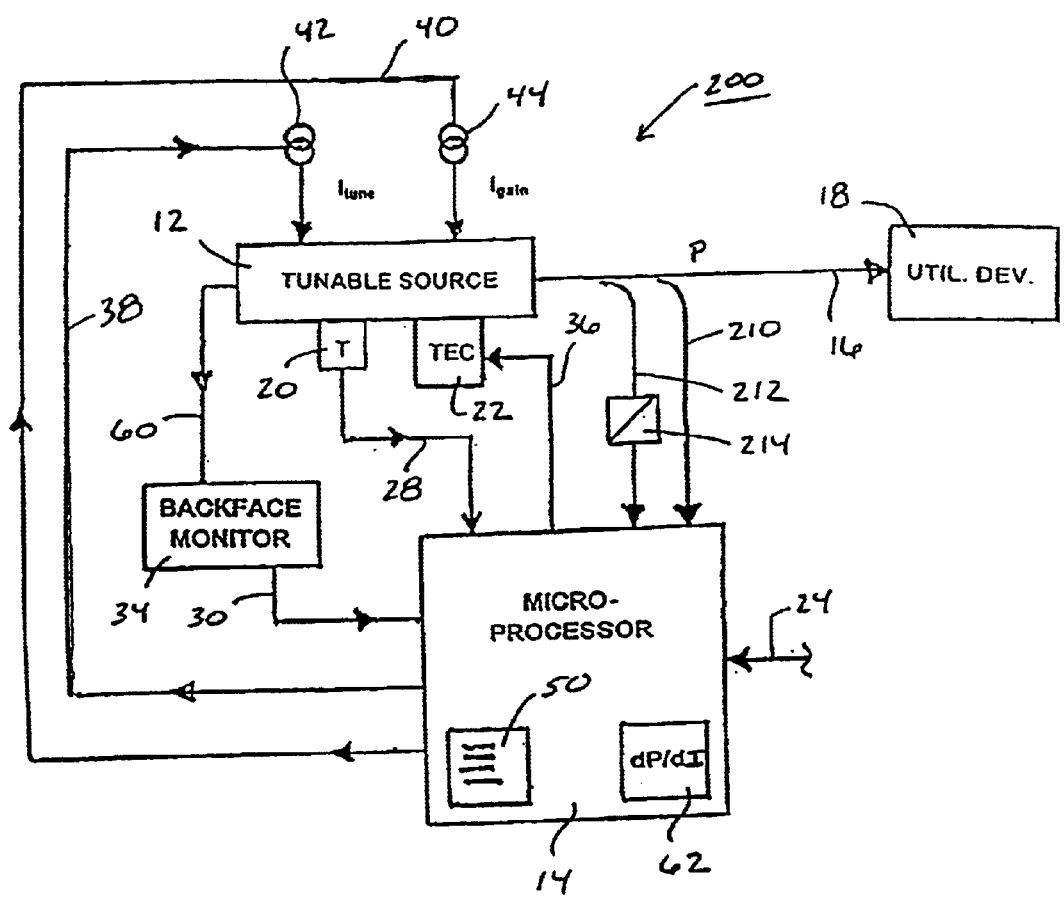
FIG. 5 is a schematic view of yet another operating system constructed in accordance with the present invention.

Turning now to FIG. 5, there is shown yet another digital processing system 200 for operating a laser device 12. The illustrated device 12 may have a wide wavelength tuning range. Consequently, the system 200 is provided with suitable feedback loops to correct for the effects of laser device aging, among other things. In particular, the system 200 has a tuning current loop that is arranged to maintain a desired relationship between the light output power P and the tuning current $I_{tune}$ as follows (equation (4)):

$$k = dP/dx, \qquad (4)$$

where k is a slope constant, P is the power output by laser device 12, $x = \log(I_{tune})$, and $I_{tune}$ is the corresponding tuning current applied to the DBR tuning section of the device 12.

Attempting to measure the slope constant k for equation (4) would be problematic in the prior art, since it would be measured by varying (or dithering) the tuning current $I_{tune}$, and since varying the tuning current $I_{tune}$ could cause an unwanted optical or wavelength shift in the laser device 12. For example, varying x ($= \log(I_{tune})$) by 10% could cause a change in the operational wavelength $\Delta\lambda/\lambda$ of about 50 ppm, which exceeds typical wavelength stability requirements. Note that $d\lambda/dx$ is approximately constant for the laser device 12, whereas $d\lambda/dI_{tune}$ varies widely. The latter value, $d\lambda/dI_{tune}$, may be approximately equal to $d\lambda/dx * (0.4343)/I_{tune}$.

The system 200 shown in FIG. 5 overcomes the problem of wavelength shifting caused by variations in the tuning current $I_{tune}$ by employing a two-path wavelength control method, with appropriate bandwidth. Thus, the illustrated embodiment may be able to correct for the effects of variation in both optical power and wavelength caused by variations in the tuning current $I_{tune}$, and the present invention may be used to meet the tight wavelength stability specifications contemplated for DWDM communications systems. In particular, the present invention makes it possible to provide the tuning signal $I_{tune}$ required for DBR laser operation without significantly degrading the wavelength control.

The illustrated system 200 obtains a reference voltage $V_{ref}$ and a filtered voltage $V_1$ based on power transmitted through a reference tap 210 and a filtered tap 212, respectively. After normalization (and ignoring noise which is small), a voltage ratio C(f) is calculated in the processor 14 as follows (equation (5)):

$$C(f) = V_1/V_{ref} \qquad (5)$$

where C(f) is the transmission fraction through the optical filter 214 in the filtered tap 212, f is the desired optical frequency, and for simplicity the two paths 210, 212 are assumed to be identical. The tuning current loop in the FIG. 5 system is based on the reference voltage $V_1$. That is, the tuning current $I_{tune}$ is periodically adjusted based on changes in the optical power P sensed at the reference tap 210, under the control of the microprocessor 14. The temperature loop is based on the transmission fraction C(f). In other words, the temperature of the TEC 22 is adjusted based on the normalized difference between the power P sensed at the reference tap 210 and the power sensed after the filter 214 in the filtered tap 212. Accordingly, the change in optical power that results from dithering the tuning current (i.e., $\Delta I_{tune}$) can be normalized out as far as wavelength control and the temperature loop is concerned.

Still, $d\lambda/dI_{tune}$ remains and is unwanted. In the illustrated embodiment, the significant effect of $d\lambda/dx$, or equivalently, $d\lambda/dI_{tune}$, is overcome by making the tuning current loop fully interactive with the temperature loop. With such loop interaction, the wavelength $\lambda$ of the light output (16) is maintained constant by the temperature loop, even as the tuning current $I_{tune}$ is varied by the tuning current loop. To accomplish the desired interaction, the bandwidth of the temperature loop may be significantly higher than that of the tuning current loop. The bandwidth difference permits the temperature loop to track and correct for wavelength changes introduced by changes in the tuning current $I_{tune}$.

To provide a rapid wavelength change (when requested via a signal 24 from the remote input device), a separate $I_{tune}$ time constant may be switched in digitally during times of wavelength change requests. Such wavelength change requests may be accomplished by supplying a suitable signal on input line 24.

While the optical power variations discussed above should not affect the operation of the temperature loop, they may be "seen" by the system 200 if they are significant. Moreover, the loop interactions described above may introduce an error in the slope measurement that may have to be verified as acceptable. If desired, the optical power slope may be measured at two different temperatures where temperature is used to hold the output wavelength constant.

While preferred embodiments of the invention have been described and illustrated, it should be apparent that many modifications can be made to the preferred embodiments without departing from the spirit or scope of the present invention. Accordingly, the invention is not limited by the foregoing description or drawings, but is only limited by the scope of the appended claims.

What is claimed as new and desired to be protected by Letters Patent of the United States:

1. A method of operating a distributed Bragg reflector laser device, said method comprising the steps of:
   operating a feedback loop to adjust a characteristic of said laser device in response to a sensed wavelength of light output from said laser device;
   operating a tuning current loop to periodically adjust a tuning current applied to said laser device in response to a signal sensed from a backface monitor of said laser device; and
   operating a power control loop to control a gain current applied to said laser device in response to a sensed signal output from the laser device, wherein said feedback loop is operationally nested inside said tuning current loop and said tuning current loop is operationally nested inside said power control loop, such that during operation of said feedback loop, said tuning current loop and the power control loop can both also be operated.

2. The method of claim 1, wherein the characteristic adjusted in response to said sensed wavelength during operation of said feedback loop is the temperature of said laser device.

3. The method of claim 2, wherein said power control loop operates an amplifier associated with said laser device.

4. The method of claim 3, wherein said power control loop is operated in response to the output power of said amplifier.

5. The method of claim 2, further comprising the step of calculating transmission fraction data based on a reference power output and a filtered power output.

6. The method of claim 1, wherein said power control loop is operated in response to a sensed amplitude signal output from said laser device.

7. The claim of 1, further comprising the step of using a backface loop to compensate for aging, said backface loop being operated based on signals said from backface monitor.

8. A method of starting-up a tunable light source, said method comprising the steps of: p1 ramping a tuning current applied to said tunable light source through a predetermined range of current levels within an operating mode;
   generating a data curve representing the relationship between the applied tuning current and the amplitude of a signal output from said tunable light source;
   storing said curve data in a first memory region;
   providing look-up data in a second memory region, said look-up data being representative of mode-hopping values for said tunable light source;
   with reference to said look-up data and said generated curve data, calculating a value representative of an optimal tuning current for said tunable light source; and
   applying said optimal tuning current to said tunable light source.

9. The method of claim 8, further comprising the step of adjusting the temperature of said tunable light source, and wherein said step of applying said tuning current occurs during said step of adjusting the temperature of said tunable light source.

10. The method of claim 9, further comprising the step of generating and storing curve data in said first memory region corresponding to the relationship between the applied tuning current and the amplitude of a signal output from said tunable light source for a second operating mode.

11. The method of claim 10, further comprising the step of applying a second tuning current signal to said tunable light source based on said curve data for said second operating mode.

12. A method of operating a laser device in a plurality of wavelength channels, said method comprising the steps of:

ramping a tuning current applied to said laser device through a predetermined range of current levels for a first wavelength;

generating and storing a data curve representing the relationship between the applied tuning current and the amplitude of a signal output from said tunable light source for said first wavelength;

ramping said tuning current applied to said laser device through a predetermined range of current levels for a second wavelength;

generating and storing a data curve representing the relationship between the applied tuning current and the amplitude of said signal output from said tunable light source for said second wavelength;

operating said laser device at said first wavelength; and operating said laser device at said second wavelength, wherein said second wavelength is different than said first wavelength.

13. The method of claim 12, wherein said step of operating said laser device at said first wavelength comprises applying to said laser device said tuning current having a level determined based on said data curve for said first wavelength, and said step of operating said laser device at said second wavelength comprises applying to said laser device said tuning current having a level determined based on said data curve for said second wavelength.

14. The method of claim 12, further comprising the step of using a thermo-electric cooler to control the temperature of said laser device, and wherein said thermo-electric cooler is operated by a digital feedback loop.

15. The method of claim 12, further comprising the step of monitoring the amplitude developed at the backface of the laser device.

16. A method of stabilizing a laser device, said method comprising the steps of:

adjusting a gain current applied to said laser device in response to signals output at the backface of said laser device to keep the power at the backface of said laser device at a constant level;

adjusting a tuning current applied to said laser device in response to output power of said laser device; and simultaneously, adjusting a wavelength characteristic of said laser device in response to an optically filtered transmission fraction of said output power.

17. The method of claim 16, wherein said adjusting steps are performed by a programmed microprocessor.

* * * * *